United States Patent
Ok et al.

(10) Patent No.: US 10,991,537 B2
(45) Date of Patent: Apr. 27, 2021

(54) VERTICAL VACUUM CHANNEL TRANSISTOR

(71) Applicant: International Business Machines Corporation, Armonk, NY (US)

(72) Inventors: Injo Ok, Loudonville, NY (US); Choonghyun Lee, Rensselaer, NY (US); Soon-Cheon Seo, Glenmont, NY (US); Seyoung Kim, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/402,302

(22) Filed: May 3, 2019

(65) Prior Publication Data
US 2020/0350136 A1    Nov. 5, 2020

(51) Int. Cl.
| | |
|---|---|
| *H01J 21/10* | (2006.01) |
| *H01J 9/02* | (2006.01) |
| *H01J 9/28* | (2006.01) |
| *H01J 19/24* | (2006.01) |

(52) U.S. Cl.
CPC ............ *H01J 21/105* (2013.01); *H01J 9/025* (2013.01); *H01J 9/28* (2013.01); *H01J 19/24* (2013.01)

(58) Field of Classification Search
CPC ........... H01L 29/41708; H01L 29/7322; H01L 29/7325
See application file for complete search history.

(56) References Cited

U.S. PATENT DOCUMENTS

| | | | | |
|---|---|---|---|---|
| 5,289,077 A | * | 2/1994 | Ugajin | H01J 21/105 |
| | | | | 313/308 |
| 6,344,674 B2 | | 2/2002 | Lu | |
| 8,213,239 B2 | | 7/2012 | Halahmi et al. | |
| 9,147,755 B1 | * | 9/2015 | Han | H01L 21/28026 |
| 9,508,520 B2 | | 11/2016 | Patti | |
| 9,761,608 B1 | * | 9/2017 | Balakrishnan | H01L 27/1203 |
| 9,793,395 B1 | * | 10/2017 | Liu | H01L 21/30604 |
| 9,853,163 B2 | | 12/2017 | Zhang | |
| 2016/0307722 A1 | | 10/2016 | Huang et al. | |
| 2017/0032921 A1 | | 2/2017 | Patti et al. | |

FOREIGN PATENT DOCUMENTS

WO    WO2009151170 A1    12/2009

OTHER PUBLICATIONS

Zyga, "Vacuum channel transistor combines best of semiconductors and vacuum tubes," Phys.org, published Apr. 4, 2017, accessed Apr. 13, 2018, 2 pages. https://phys.org/news/2017-04-vacuum-channel-transistor-combines-semiconductors.html.

Han et al., "Vacuum nanoelectronics: Back to the future?—Gate insulated nanoscale vacuum channel transistor," AIP Applied Physics Letters, vol. 100, 2012, 5 pages. https://aip.scitation.org/doi/pdf/10.106311.4717751?class=pdf.

* cited by examiner

*Primary Examiner* — Jay C Chang
*Assistant Examiner* — Mikka Liu
(74) *Attorney, Agent, or Firm* — Yee & Associates, P.C.

(57)    ABSTRACT

A vertical vacuum transistor with a sharp tip structure, and associated fabrication process, is provided that is compatible with current vertical CMOS fabrication processing. The resulting vertical vacuum channel transistor advantageously provides improved operational characteristics including a higher operating frequency, a higher power output, and a higher operating temperature while at the same time pro- (Continued)

viding a higher density of vertical transistor devices during the manufacturing process.

7 Claims, 9 Drawing Sheets

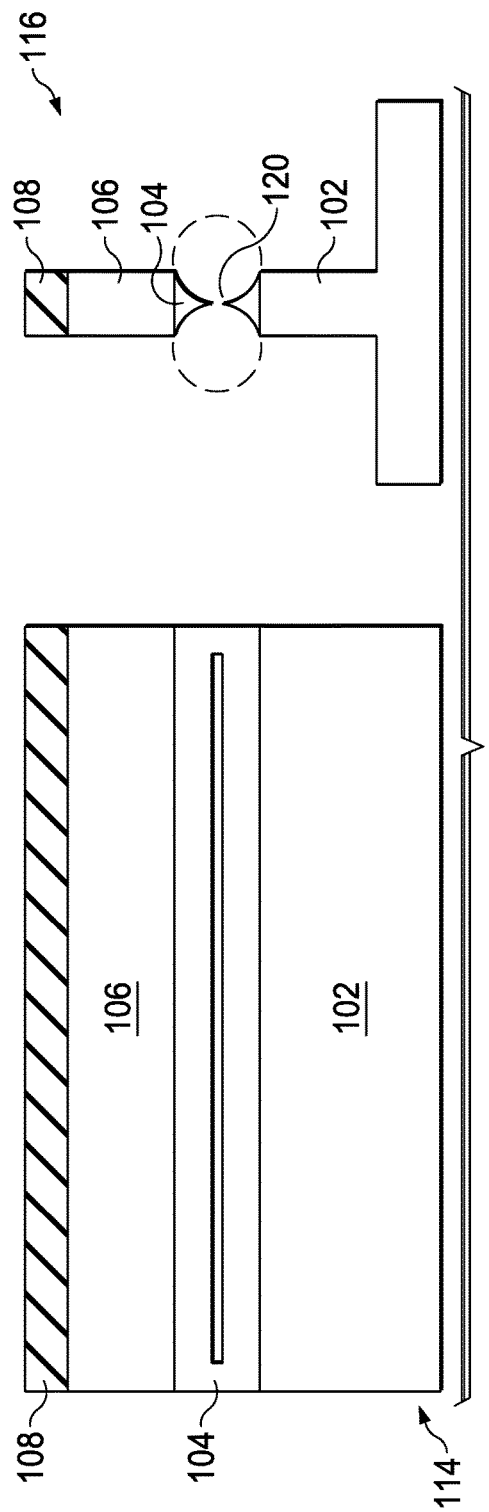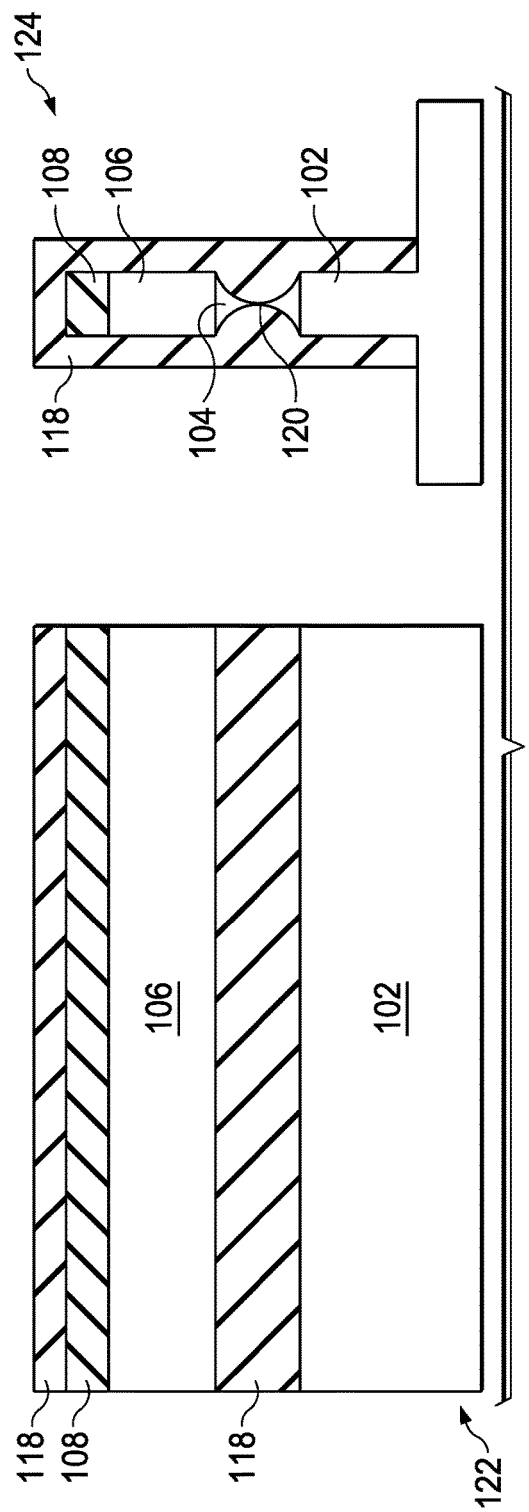

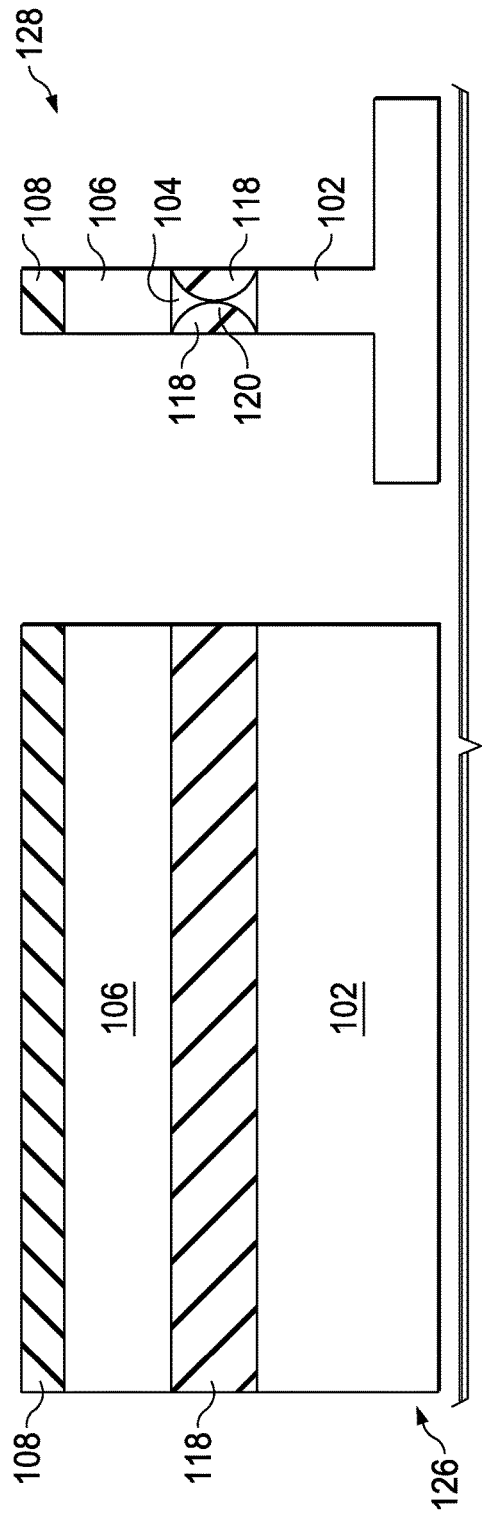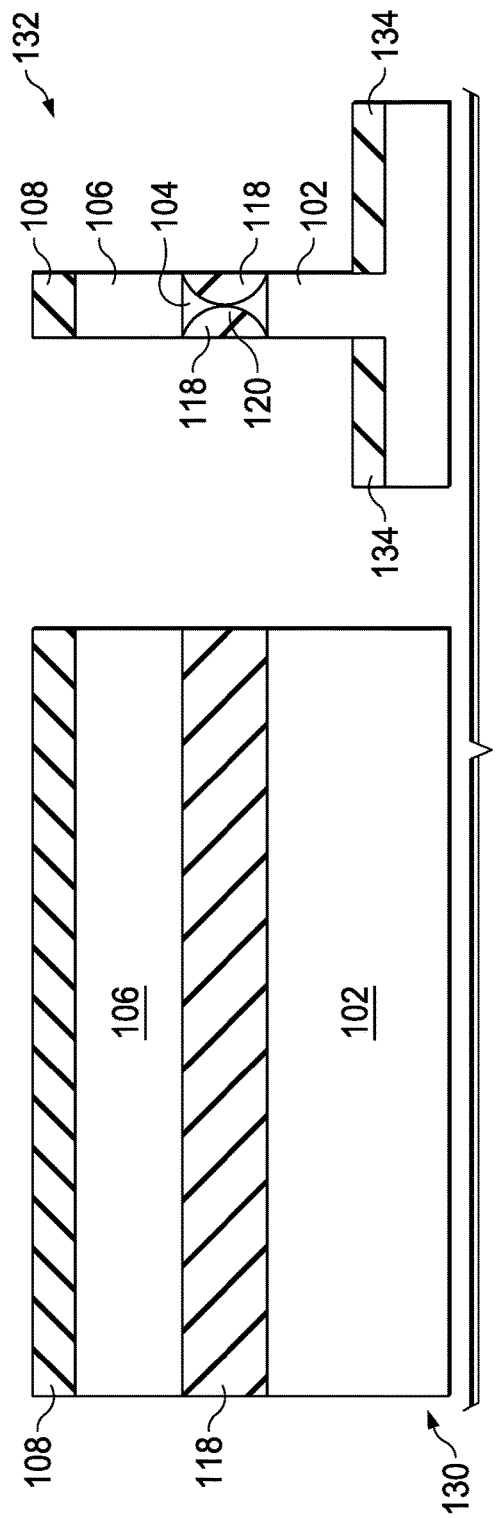

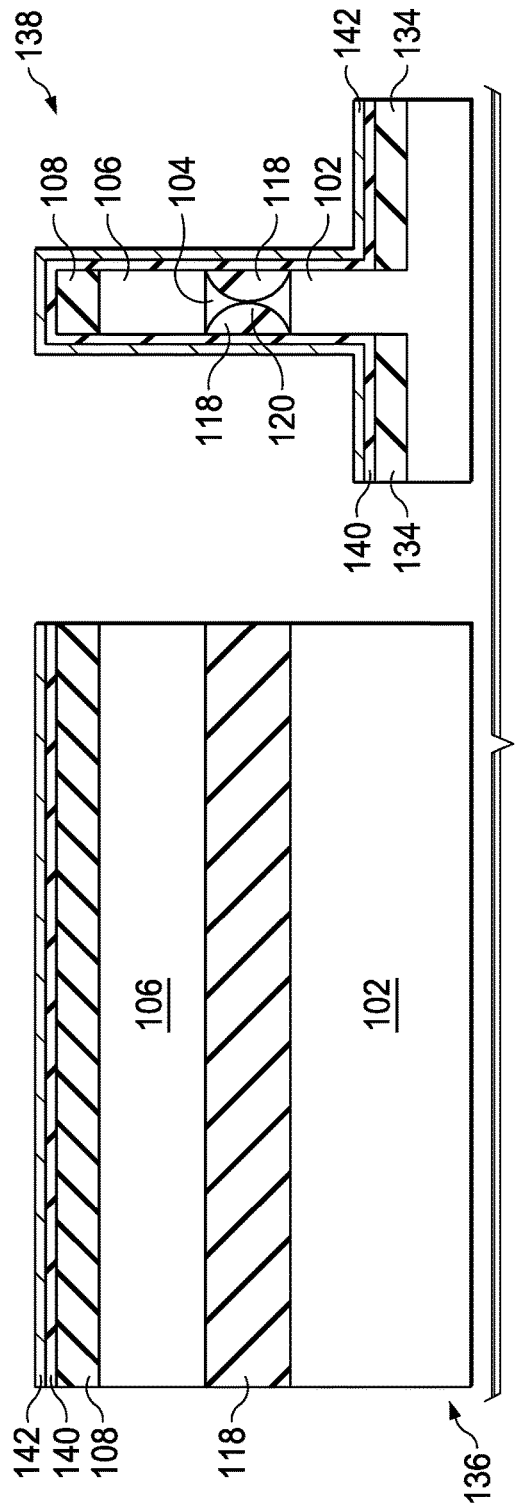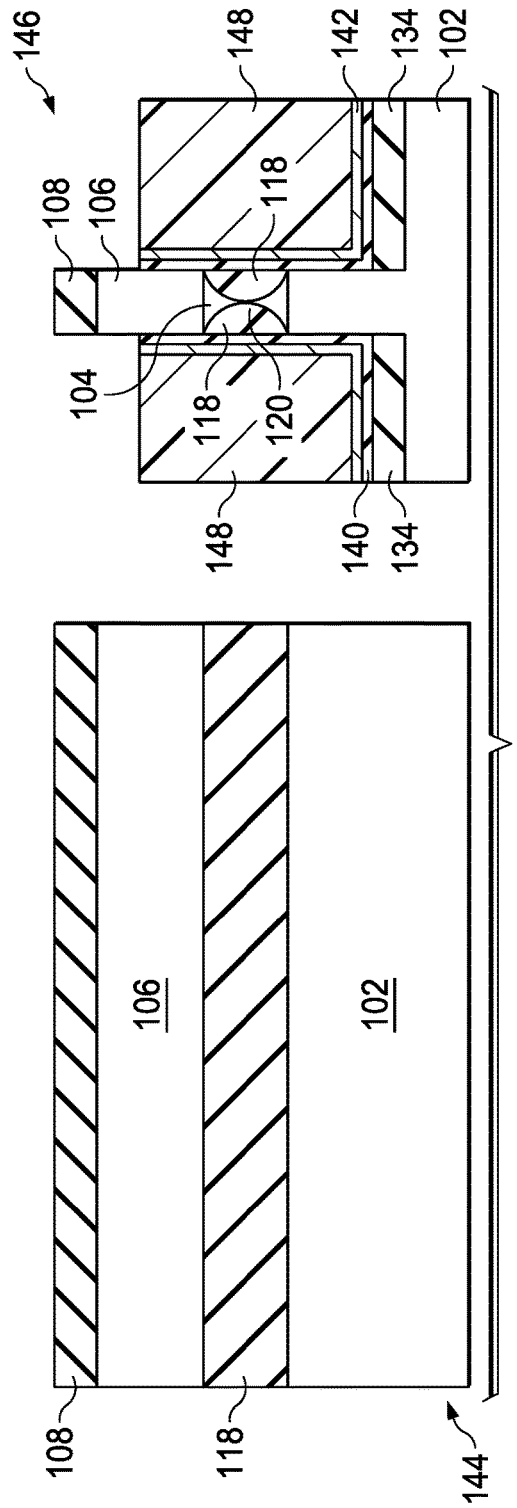

VERTICAL VACUUM CHANNEL TRANSISTOR

BACKGROUND

The disclosure relates generally to integrated circuit devices and associated fabrication techniques, and more specifically to a vacuum channel transistor device and associated fabrication of such vacuum channel transistor device.

A nanoscale vacuum-channel transistor (NVCT) is a transistor in which the electron transport medium is a vacuum. In a traditional solid-state transistor, a semiconductor channel exists between the source and drain, and the current flows through the semiconductor channel. However, in a nanoscale vacuum channel transistor, no material exists between the source and drain, and therefore the current flows through the vacuum channel. The advantages to using a nanoscale vacuum-channel transistor include higher operating frequency and power output, and operation at higher temperatures and radiation levels than a traditional transistor.

For a general background discussion of vacuum channel transistors, refer to "Vacuum nanoelectronics: Back to the future?—Gate insulated nanoscale vacuum channel transistor" authored by Jin-Woo Han, Jae Sub Oh, and M. Meyyappan (Appl. Phys. Lett. 100, 213505 (2012)).

Prior attempts at fabricating a vacuum channel device use a planar structure in which the areas of the source and drain takes up a large area that limits the possibility of being used for integrated circuits. In addition, the cathode/anode tips for thermionic emission is made up of anneal, which isn't sharp enough to produce efficient field emission to justify the power/performance requirements for modern transistors.

SUMMARY

According to one embodiment of the present invention, a vertical vacuum channel transistor with a sharp tip structure, and associated fabrication process, is provided that is compatible with current vertical CMOS fabrication processing. The resulting vertical vacuum channel transistor advantageously provides improved operational characteristics including a higher operating frequency, a higher power output, and a higher operating temperature while at the same time providing a higher density of vertical transistor devices during the manufacturing process.

BRIEF DESCRIPTION OF THE DRAWINGS

FIG. 3 depicts selective SiGe etching from the side to form a sharp SiGe tip;
FIG. 4 depicts a conformal SiO2 deposition;
FIG. 5 depicts isotropic SiO2 etching;
FIG. 6 depicts formation of a bottom spacer;
FIG. 7 depicts a dielectric and metal deposition all around the fin;
FIG. 8 depicts high-K/Metal Chamfering via OPL deposition, OPL recess and high-K/metal etching.

DETAILED DESCRIPTION

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 1:
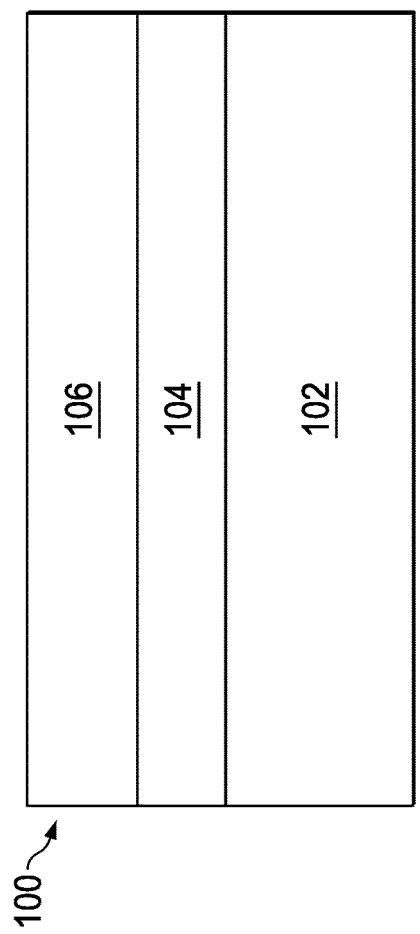
FIG. 1 is a depiction of an Epi layer substrate formation.

With reference to FIG. 1, there is depicted a substrate epitaxial (Epi) layer stack formation 100. This substrate stack formation includes a collector layer 102 comprising N+ type Si, an approximately 10-20 nm thick SiGe layer 104, and an emitter layer 106 comprising N+ type Si. SiGe is preferably chosen due to its ease of use during the manufacturing process for such things as being selectively etched by a diluted hydrofluoric acid (dHF) wet etching process. The thickness of the SiGe layer 104 was chosen to facilitate controlling formation of the sharp tip structure that is further described below, including the gap distance between the two tip portions of the sharp tip structure. Highly doped Si is formed using a traditional ion implantation followed by drive in anneal, as further described in US20140120678A1.

Figure 2:
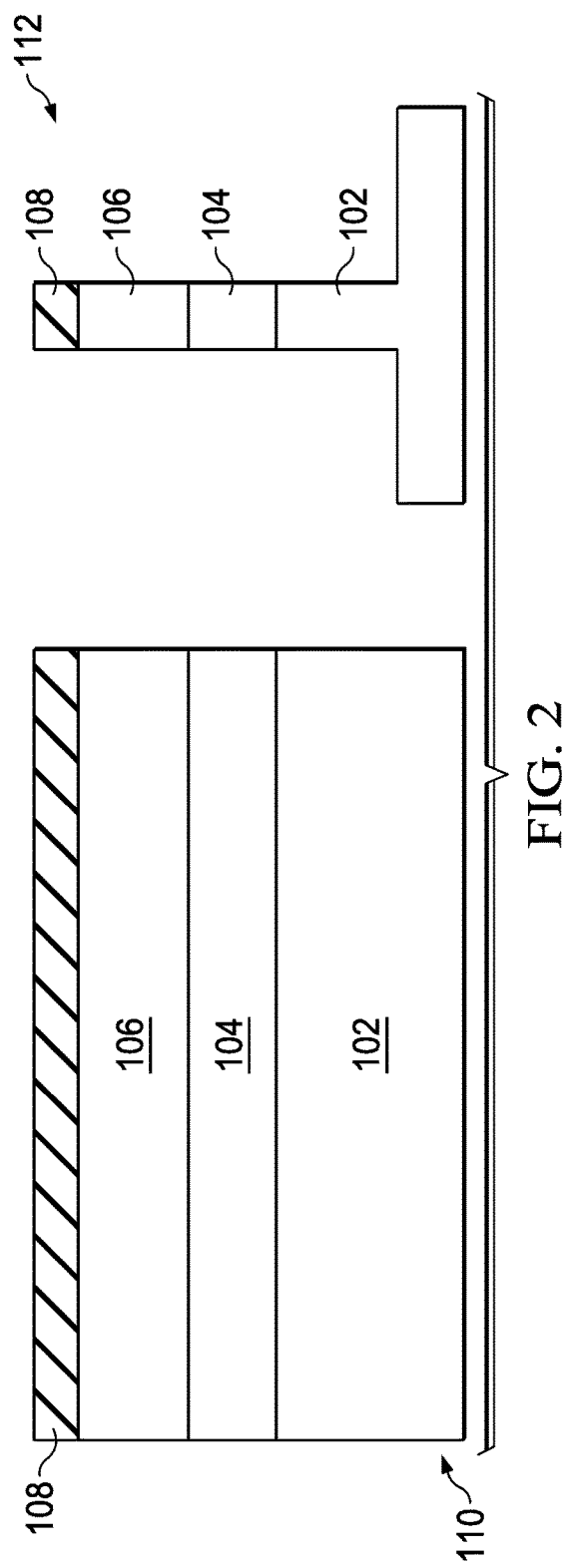
FIG. 2 is a depiction of a fin formation via patterning.

FIG. 2 depicts a fin formed using a patterning technique, and shows a view parallel to the fin at 110, and a view across the fin (aka, perpendicular to the fin) at 112. As can be seen, a hard mask (HM) layer 108 has been deposited over the emitter layer 106. In a preferred embodiment, this hard mask layer comprises SiN, but the hard mask could also be formed using similar materials such as NBlock, SiO2, SiCN, etc. The hard mask is used to pattern the fin area, shown in the across the fin view 112 of FIG. 2.

FIG. 3 depicts formation of a sharp tip structure 120 formed within SiGe layer 104, where such sharp tip structure 120 that includes two tip portions is formed using RIE etching from the side, as depicted by the circular indicators depicted in FIG. 3. The time for such etching is not critical, and may be a relatively short period of time, such as 2-20 seconds, or a longer period of time such as 100 seconds. Alternatively, SiGe wet etching could be used to form the sharp tip structure 120. Preferably, the gap distance between the two tip portions of the sharp tip structure 120 is less than 150 nm for proper transistor operation. There must be some separation or gap between the two tip portions of the sharp tip structure 120 sufficient to form a vacuum channel between the two tip portions (as shown by the gap between the two tip portions of sharp tip structure 120 shown in view 116 of FIG. 3). Opposite portions of the SiGe layer 104, which now form the sharp to structure 120, may be referred to as a collector and an emitter of a vacuum transistor. As the channel distance becomes less than the mean free path of electrons in air, the vacuum requirement itself is relaxed, and the field emission voltage is reduced to a value smaller than the ionization potential of molecules in air. As such, the present device can be referred to as the vacuum channel transistor even though it operates at atmospheric conditions. The process during SiN sealing provides less than 1E-3 torr, and therefore the air gap will have enough vacuum to make vacuum channel. In some embodiments, an oxidation process may also performed, if needed, using rapid thermal anneal (RTP), pulsed time anneal, or laser anneal. Generally, a separate oxidation process is not required, but may be needed in certain situations, such as when the etching is performed in a relatively short period of time such as 2-20 seconds. Oxidation may also be required if a different material other than SiGe is used, such as doped Si or a lower percentage of SiGe, where an oxidation process is performed prior to the wet etching used to form sharp tip structure 120. For example, if we have SiGe with lower than 25% of Ge structure, thermal oxidation will be required. The reason is that SiGe with higher than 25% of Ge is easy to selective etching but with a lower Ge percentage, such as below 25%, thermal oxidation will improve selective oxidation and selective etching. The resulting structure parallel to the fin is depicted at 114, and the resulting structure across the fin is depicted at 116.

Next, and as shown in FIG. 4 by the parallel to the fin view 122 and across the fin view 124, a conformal deposition process is performed to deposit an oxide 118 that surrounds collector layer 106, sharp tip structure 120, and the upper portion of emitter layer 102 of the fin, as can be seen in the across the fin view 124. For example, in an embodiment, the oxide 118 includes SiO2 deposited using Plasma Enhanced Chemical vapor deposition (PECVD), low pressure chemical vapor deposition (LPCVD), atomic layer deposition (ALD) or a chemical vapor deposition (CVD) type of process. SiO2, or similar material such as SiBCN or SiOCN, is used in order to be able subsequently selectively remove such material by a subsequent WET etching process.

FIG. 5 shows the resulting structure the parallel to the fin view 126 and the across the fin view 128 after an isotropic etching process is performed to remove portions of the oxide 118. For example, the etching removes portions of the oxide 118 selective to collector layer 102, emitter layer 106, hard mask layer 108, and remaining portions of SiGe layer 104. As shown, portions of the oxide 118 are removed from top and sidewalls of the fin, leaving small (semi-circular) portions of the oxide 118 surrounding the sharp tip structure 120.

FIG. 6 shows the resulting structure in the parallel to the fin view 130 and the across the fin view 132 after performing a combination of a high density pressure (HDP) deposition process using silicon nitride (SiN) followed by an etch back process in order to form bottom spacer 134. In a preferred embodiment, an approximate 9 nm SiN deposition is etched back 3 nm, resulting in an approximate 6 nm thick bottom spacer 134. This etch back is needed to remove any material on the sidewalls and produce the spacer 134 since the original deposition process may cause some small amount of material to deposit on sidewalls of the fin. The bottom spacer 134 is an isolation layer separating the gate and contact 182 in FIG. 14. If we don't have this bottom SiN layer, then the RIE etching may attack the high-k layer or there could be some leakage between the gate and collector through the high-k layer.

FIG. 7 shows the resulting structure in the parallel to the fin view 136 and the across the fin view 138 after depositing a High-k dialectic material 140 and a metal gate material 142 all around the fin using a traditional deposition process such as atomic layer deposition (ALD) or physical deposition process (PVD), with ALD being the preferred deposition process for depositing both the High-k material 140 and the metal gate material 142.

FIG. 8 shows the resulting structure in the parallel to the fin view 144 and the across the fin view 146 after performing a combination of an organic planarization layer (OPL) deposition, OPL recess and a High-k/metal etching process. First, an OPL is deposited, and then a recessed OPL portion 148 is subsequently formed from the deposited OPL by an RIE (or WET) process. The deposited OPL acts as a protection layer that protects the inner high-K 140 and metal 142 layers during the high-K/metal etching process. The portions of the high-k layer 140 and metal layer 142 that are above the upper planar surface of the OPL recess portion 148 and on the side of the fin are selectively removed by an RIE (or WET) process. The organic planarization layer (OPL) and/or a photo-resist layer (PR) acts as a mask to protect the underlying SiN/SiO/SiN stack during the RIE process.

Figure 9:
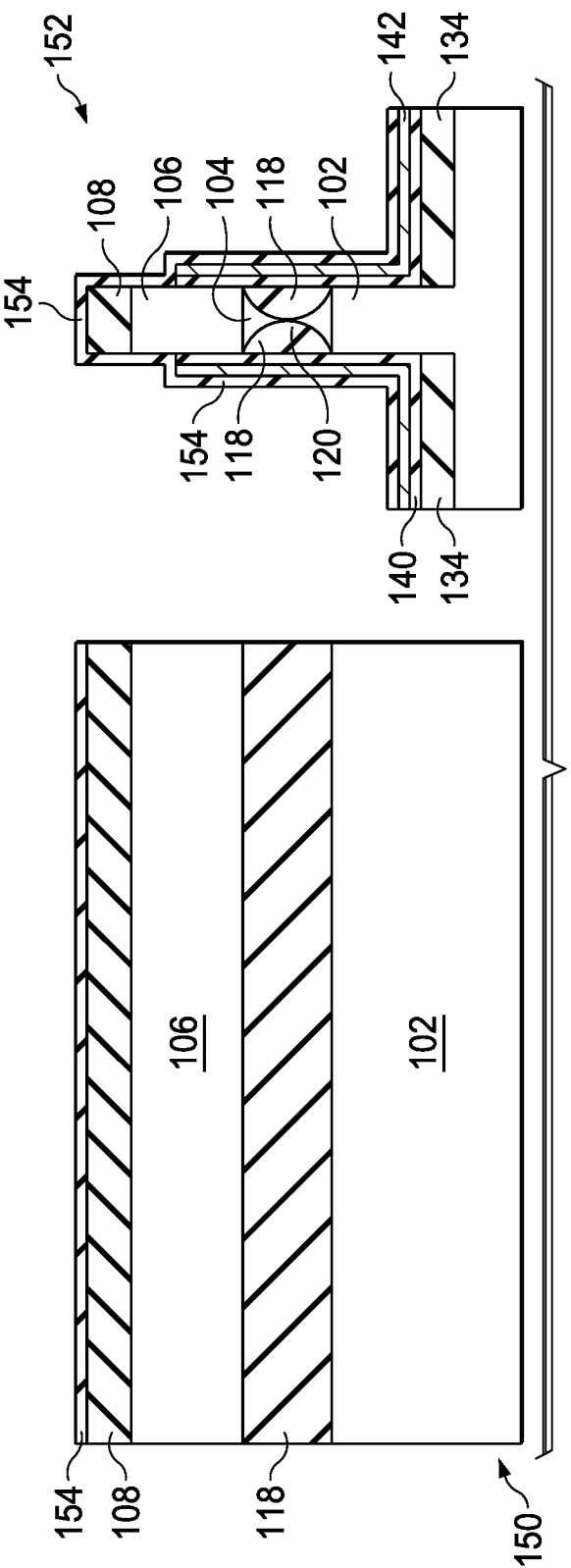
FIG. 9 depicts a conformal SiN liner.

FIG. 9 shows the resulting structure in the parallel to the fin view 150 and the across the fin view 152 after removing the OPL recess 148 (as shown in FIG. 8) using an OPL ashing process, and then forming a conformal SiN liner 154 using a PECVD, ALS, or LPCVD based process. The OPL ashing process may be accomplished using RIE which provides an O2, CO2, and N2H2 ashing process. The SiN liner 154 is used to support the resulting vacuum transistor since High-k such as HfO2, ZrO2, Al2O3 with 2 nm and metal gate such as TiN (Al) or TaN with 2 nm-5 nm may not enough to support when the inner oxide is removed by WET. We need additional SiN layer with 10 nm-50 nm thickness to support a subsequent RIE and WET process. At this point, the fin needs to be cut in order to open a side and make a desired fin size.

Figure 10:
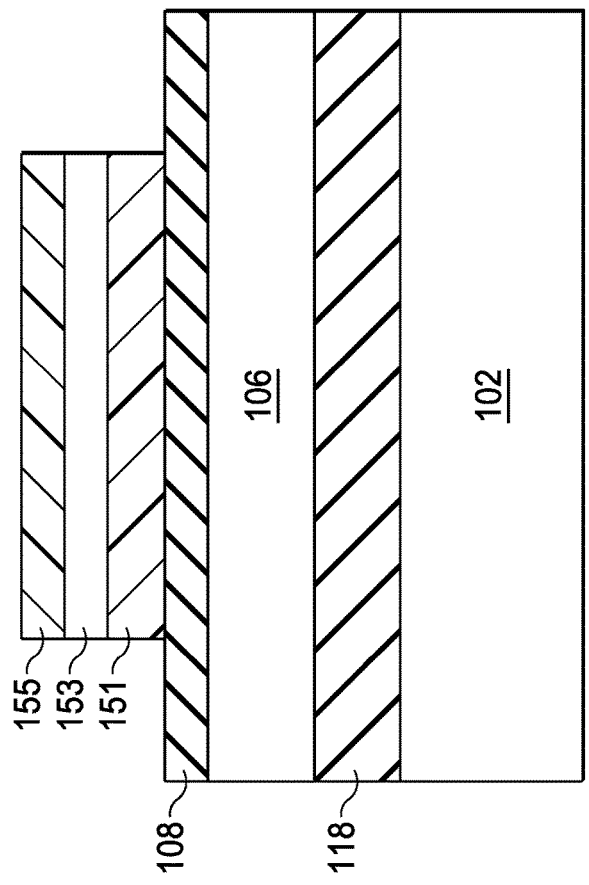
FIG. 10 depicts a result of an OPL/SiARC (or TiARC)/PR coating process.

Continuing with FIG. 10, a three layer mask is used to pattern the fin to a final length. In an embodiment, the three layer mask includes an OPL layer 151, a silicon-containing anti-reflective coating layer (SiARC) 153, and a photo-resist layer 155. The OPL layer 151 may be approximately 200 nm thick and is formed on the hard mask (HM) layer 108. The OPL layer 151 acts as a protection layer during subsequent etching. The silicon-containing anti-reflective coating layer (SiARC) 153 may be approximately 35 nm thick and is formed on the OPL layer 151. In some embodiments, a titanium anti-reflective coating (TiARC) may be used for the anti-reflective coating layer 153 rather than SiARC. The photo-resist layer 155 may be approximately 100 nm thick and is formed on the SiARC layer 153. This OPL/ARC/PR three-layer mask is then patterned using a standard lithography process to form a desired cut mask pattern.

Figure 11:
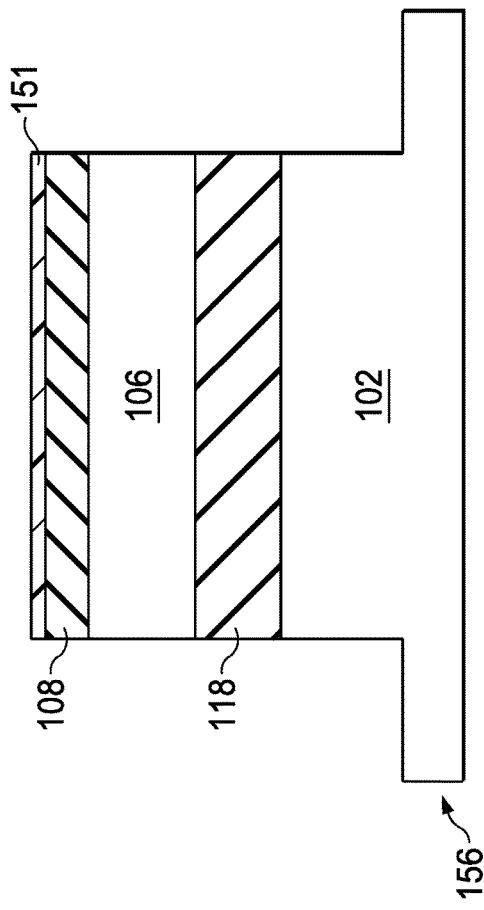
FIG. 11 depicts a result of an HM/Si/SiO2/Si etching process.
Figure 12:
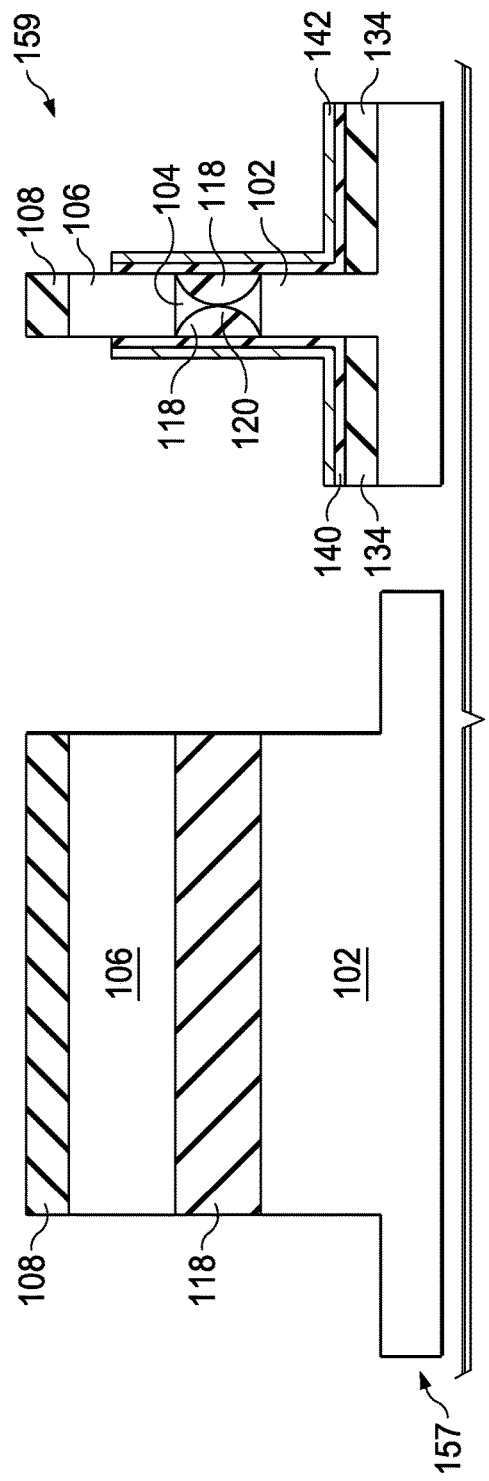
FIG. 12 depicts a fin cut to open the side in order to make a desired fin size.

The HM/Si/SiO2/Si stack 108/151/153/155 is then etched using an RIE etching process in order to cut the fin, as shown by view 156 of FIG. 11. A residual portion of the OPL layer 151 approximately 100 nm thick remains on the hard mask 108 that has now been cut by the etching process. An OPL ashing step is then performed to remove the residual OPL layer 151 shown in FIG. 11, resulting in the cut fin structure depicted by views 157 and 159 of FIG. 12.

Figure 13:
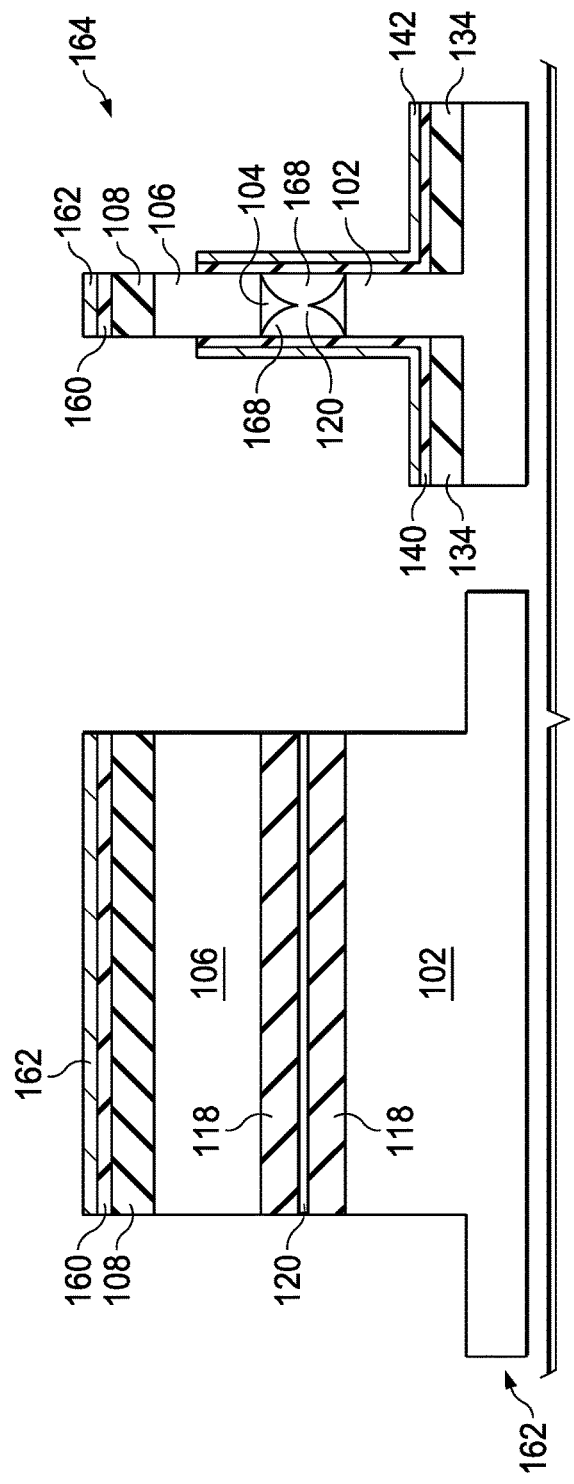
FIG. 13 depicts removal of inside oxide.

FIG. 13 shows the resulting structure in the parallel to the fin view 162 and the across the fin view 164 after removing remaining portions of the oxide layer 118. Here, a dHF WET process is used to selectively remove the remaining semi-circular portions of the oxide layer 118 from within the fin and around the sharp tips 120, leaving voids 168 on both sides of the sharp tip structure 120 that are adjacent to the curved region that extends away from the two tip portions of the sharp tip structure 120. The sharp tip structure 120 may also be adjusted during this WET etching process in order to achieve a desired gap distance between opposing sharp tips of the sharp tip structure 120, for example, between the emitter and the collector. Adjusting the gap distance between the emitter and the collector will change the operational characteristics of the transistor. For example, the required turn-on voltage is proportional to the gap distance between the emitter and collector such that the turn-on voltage increases as the gap distance increases. As previously mentioned above, the gap distance between the two opposing sharp tips 120 should be kept less than 150 nm in order to limit the turn-on voltage from becoming too large. In some embodiments, for example, the SiGe layer 104 is first etched to form the sharp tips 120 with a gap distance less than the desired gap distance, and the desired gap distance is subsequently achieved during etching and removal of the oxide layer 118.

Figure 14:
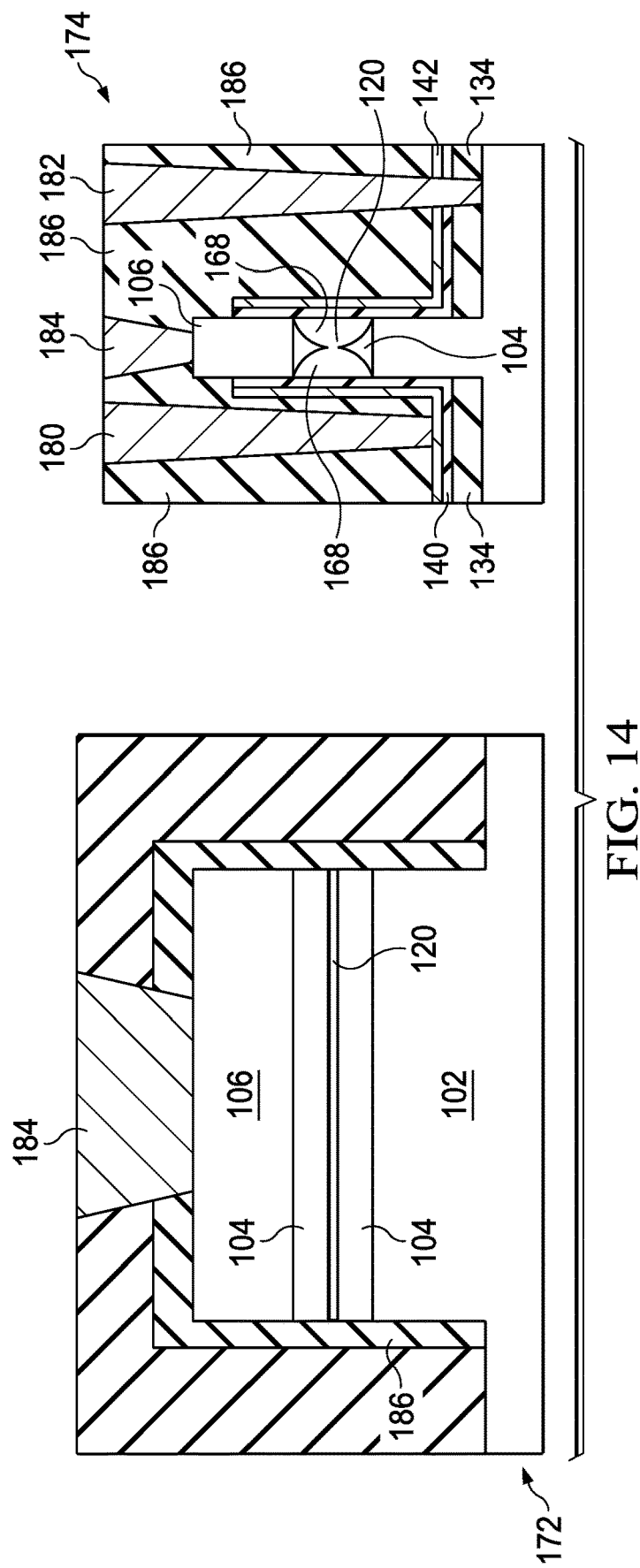
FIG. 14 depicts metal contact formation.

FIG. 14 shows the resulting structure in the parallel to the fin view 172 and the across the fin view 174 after formation of the metal contacts 180, 182 and 184 for the respective gate, emitter and collector of the vertical vacuum channel transistor. First, field oxide 186 is deposited, and then patterned to form trenches therein which are then deposited with metal, followed by a chemical metal planarization (CMP) process.

Figure 15:
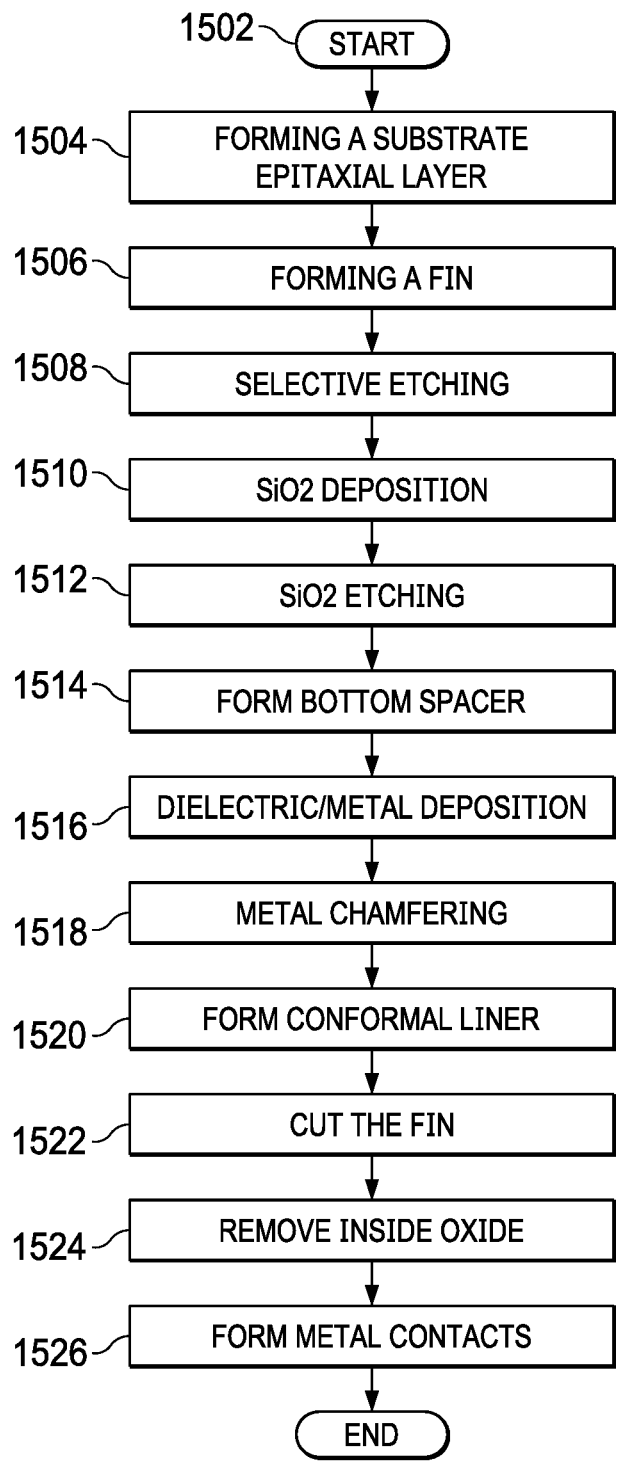
FIG. 15 is a flow process used to form a vertical vacuum channel transistor.

FIG. 15 depicts a flow process used to form a vertical vacuum channel transistor. The processing starts at 1502, and proceeds to step 1504 to form a substrate epitaxial layer as depicted in FIG. 1. The process then proceeds to step 1506 to form a fin as depicted in FIG. 2. The process then proceeds to step 1508 to selectively etch SiGe material to form a sharp tip structure as depicted in FIG. 3. The process then proceeds to step 1510 to deposit SiO2 material around the fin as depicted in FIG. 4. The process then proceeds to step 1512 to etch the deposited SiO2 material to remove all but two semicircle SiO2 regions adjacent the sharp tip structure as depicted in FIG. 5. The process then proceeds to step 1514 to form a bottom spacer as depicted in FIG. 6. The process then proceeds to step 1516 to deposit a dielectric and then a metal material around the fin as depicted in FIG. 7. The process then proceeds to step 1518 to remove the deposited metal, as depicted in FIG. 8. The process then proceeds to step 1520 to form a conformal SiN liner as depicted in FIG. 9. The process then proceeds to step 1522 to cut the fin to a desired size, as depicted in FIG. 10. The process then proceeds to step 1524 to remove the SiO2 oxide inside the fin as depicted in FIG. 13, thereby forming a vacuum channel that comprises the sharp tip structure 120 (per FIG. 12). The process then proceeds to step 1526, where gate, emitter and collector contacts are formed as depicted in FIG. 14. The process then ends.

Thus, illustrative embodiments of the present invention provide a vertical vacuum transistor with a sharp tip structure that is compatible with current vertical CMOS fabrication processing.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A vertical vacuum channel transistor, comprising:
   a sharp tip structure comprising two tip portions, wherein one tip portion of the two tip portions is an emitter of the vertical vacuum channel transistor and another tip portion of the two tip portions is a collector of the vertical vacuum channel transistor;
   a vacuum channel between the two tip portions; and
   a gate of the vertical vacuum channel transistor, wherein a metal contact for each of the emitter, the collector and the gate of the vertical vacuum channel transistor is formed in a respective trench for each of the emitter, the collector and the gate of the vertical vacuum channel transistor that each extend downward in a vertical direction from a common top surface, wherein the two tip portions are formed from a silicon germanium (SiGe) material, wherein the silicon germanium (SiGe) material is a portion of an inverted T-shaped fin structure, and further comprising:
   a bottom spacer formed on a horizontal surface of the inverted T-shaped fin structure;
   a high-K dielectric layer formed on sidewalls of the inverted T-shaped fin structure; and
   a metal gate layer formed on the high-K dielectric layer, wherein the high-K dielectric layer is also formed on a top surface of the bottom spacer.

2. The vertical vacuum channel transistor of claim 1, wherein the one tip portion and the another tip portion are separated by the vacuum channel that is less than 150 nm in length.

3. The vertical vacuum channel transistor of claim 1, where the bottom spacer is formed from a silicon nitride (SiN) material.

4. The vertical vacuum channel transistor of claim 1, wherein the bottom spacer is an isolation layer that separates the gate and the metal contact for the emitter.

5. A vertical vacuum channel transistor, comprising:
   a sharp tip structure comprising two tip portions, wherein one tip portion of the two tip portions is an emitter of the vertical vacuum channel transistor and another tip portion of the two tip portions is a collector of the vertical vacuum channel transistor;
   a vacuum channel between the two tip portions; and
   a gate of the vertical vacuum channel transistor, wherein the two tip portions are formed from a silicon germanium (SiGe) material, and wherein the one tip portion and the another tip portion are separated by the vacuum channel that is less than 150 nm in length, wherein the silicon germanium (SiGe) material is a portion of an inverted T-shaped fin structure, and further comprising:
   a bottom spacer formed on a horizontal surface of the inverted T-shaped fin structure;

a high-K dielectric layer formed on sidewalls of the inverted T-shaped fin structure; and
a metal gate layer formed on the high-K dielectric layer, wherein the high-K dielectric layer is also formed on a top surface of the bottom spacer.

6. The vertical vacuum transistor of claim 5, where the bottom spacer is formed from a silicon nitride (SiN) material.

7. The vertical vacuum channel transistor of claim 5, wherein the bottom spacer is an isolation layer that separates the gate and a metal contact for the emitter.

* * * * *